OSCILLATOR TUNING AND CONTROL OVER LARGE RANGE

Filed Nov. 3, 1958 4 Sheets-Sheet 1

SHOLLY KAGAN
JOHN E. OLBRYCH
INVENTORS

BY Alden D Redfield
Abraham Ogman
ATTORNEYS

OSCILLATOR TUNING AND CONTROL OVER LARGE RANGE

Filed Nov. 3, 1958 4 Sheets-Sheet 2

SHOLLY KAGAN
JOHN E. OLBRYCH
*INVENTORS*

BY Alden D Redfield
Abraham Ogman
ATTORNEYS

SHOLLY KAGAN
JOHN E. OLBRYCH
*INVENTORS*

BY Alden D Redfield
Abraham Ogman
ATTORNEYS

SHOLLY KAGAN
JOHN E. OLBRYCH
INVENTORS

BY Alden D Redfield
Abraham Ogman
ATTORNEYS

United States Patent Office 3,137,824

Patented June 16, 1964

3,137,824
OSCILLATOR TUNING AND CONTROL OVER LARGE RANGE

Sholly Kagan, Newton Highlands, Boston, and John E. Olbrych, Salem, Mass., assignors to Avco Manufacturing Corporation, Cincinnati, Ohio, a corporation of Delaware Filed Nov. 3, 1958, Ser. No. 771,459
11 Claims. (Cl. 331—19)

This invention relates to a system and method of precision tuning, and in particular to a system and method in which, with the use of a single crystal, an oscillator may be tuned and held precisely to a selected one of a large number of frequencies within a frequency band.

Oscillator tuning methods of the prior art include means whereby frequencies are added or subtracted to harmonics of a frequency stabilized source and the desired frequency is derived by means of filtering devices. The principal objection to this means for tuning oscillators is the requirement for complex apparatus to filter out the undesired frequencies and harmonics which naturally flow from this mode of operation.

Other prior art methods include the use of a precision calibrated oscillator, and methods whereby frequencies are added to synthesize a specific frequency. The former method is plagued by drift problems caused by variations in ambient conditions or in the characteristics of the oscillator elements with time.

The latter method has been found to be unreliable because it is prone to produce spurious frequencies caused by thermal effects or radiated noise in the equipment and time variations, or jitter, of the signals making up the composite signal.

Frequent attempts have been made to avoid the above described limitations by governing the tuning of an oscillator by means of impulse signals. An impulse governed oscillator system is simple to construct and theoretically can be made extremely stable. It employs a technique whereby the repetition rate of a frequency stabilized periodic pulse signal is phase compared with the phase of the oscillator output signal which is varying in frequency. Normally the oscillator is, by calibration or other means, adjusted to approximately a selected frequency. The impulse signal is then used to obtain the precise selected frequency. These prior systems although simple in construction, are particularly vulnerable to jitter with the result that there is frequently produced spurious frequencies which undermine the tuning accuracy and the frequency stability of the system. An article which emphasizes and describes spurious effects in impulse governed oscillators has been prepared by Gaston Salmet and is published in the November 1956 issue of the Proceedings of the IRE at page 1582.

The present invention constitutes a means for exploiting the advantages of the impulse governed oscillator and for providing unambiguous tuning and crystal stability.

It is an object of the invention to provide a new and improved system and method of tuning an oscillator to a selected one of a large number of frequencies in a frequency band using a single frequency stabilized source.

It is still another object of the invention to provide a new and improved system and method of precision tuning which is capable of unambiguously selecting one of a vast number of oscillator frequencies.

It is still another object of the invention to provide a new and improved system and method of precision tuning which encompasses a semiautomatic means for rapidly selecting and tuning an oscillator to a specific frequency.

Other objects of the invention are to provide a new and improved precision tuning which:

(1) Includes means for counting the number of frequency coincidences between phase and repetition rate stabilized pulse signal and the output of a tunable oscillator and utilizing the count for controlling the setting of the oscillator.

(2) Includes means for preventing the generation of spurious frequencies.

(3) Includes means for preventing the oscillator from drifting off the tuned frequency.

(4) Is capable of being constructed with substantially less complexity than known systems of equal performance.

In accordance with the invention, the precision tuning system comprises means for providing a frequency stabilized signal, and tunable means for providing a periodic signal. In this discussion a signal whose phase and repetition rate are constant is designated as a frequency stabilized signal. The system also includes means coupled to the frequency stabilized means for developing a pulse signal whose repetition rate is related to the stabilized frequency. There is also provided means responsive to the periodic signal and the pulse signal for developing trigger signals when the frequency of the periodic signal and the repetition rate of the pulse signal are integrally related. This system also includes means responsive to the trigger signals for determining when a predetermined number of trigger signals have been developed, at which time a control signal is generated. Finally, the precision tuning system includes tuning means coupled between the tunable means and the last mentioned means for varying the frequency of the periodic signal through a band of frequencies which includes a selected frequency, the tuning means being responsive to the control signals for terminating the tuning action when the tunable means is adjusted to the selected frequency.

Also in accordance with the invention, the method of precisely tuning an oscillator to a specific frequency comprises (1) activating an oscillator tuning mechanism which is adapted to tune the oscillator through a band of frequencies containing the specified frequency; (2) deriving a signal from the oscillator which is compared with a frequency stabilized signal and generating trigger signals each time the compared signals are integrally related; (3) counting the trigger signals until a predetermined count is obtained, at which time a control signal is generated, which deactivates the tuning mechanism and terminates the oscillator tuning operation.

The novel features that are considered characteristic of the invention are set forth in the appended claims; the invention itself, however, both as to its organization and method of operation, together with additional objects and advantages thereof, will best be understood from the following description of a specific embodiment when read in conjunction with the accompanying drawings, in which:

Figure 1:
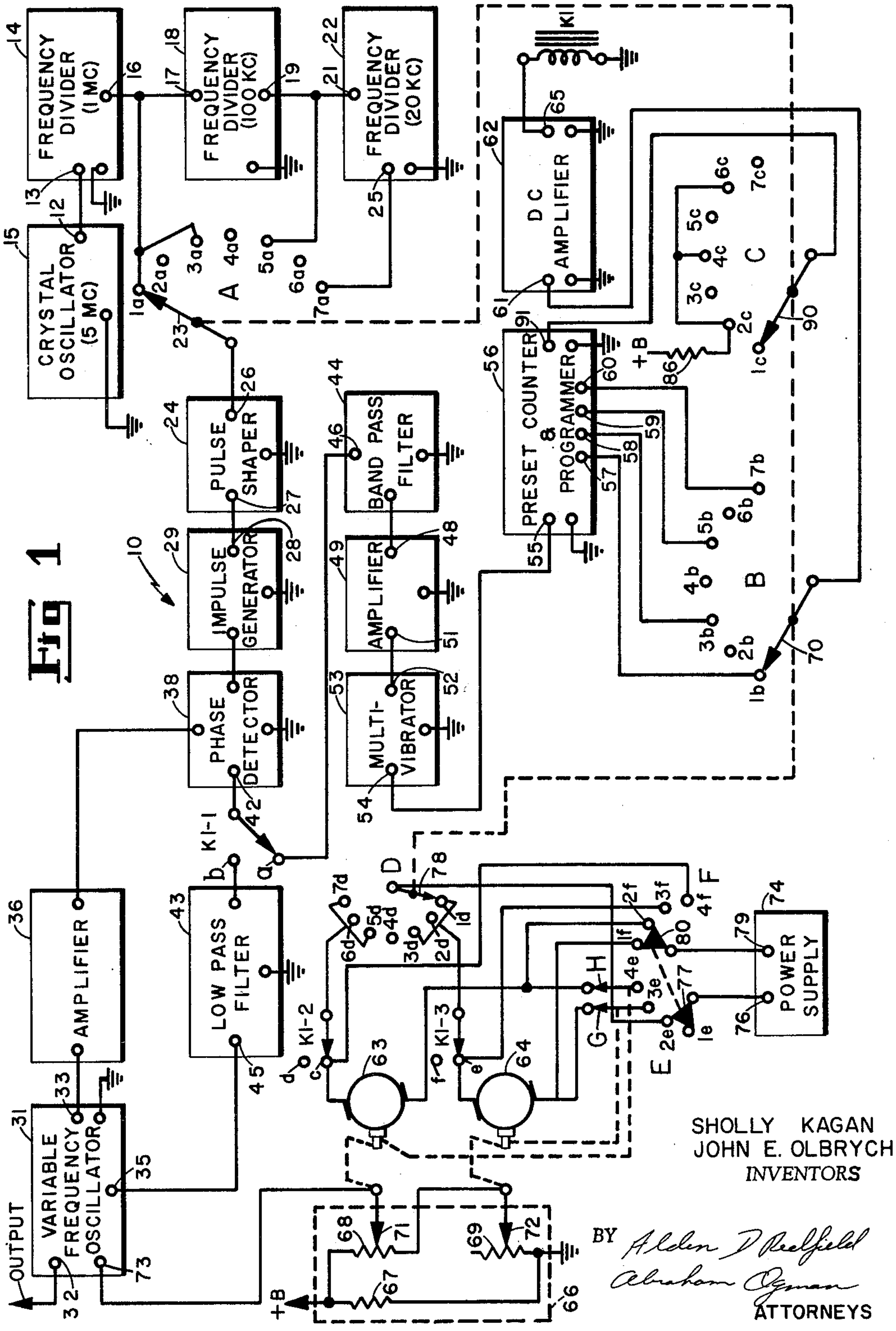
FIG. 1 is a block diagram of a preferred precision frequency tuning system embodying the principles of the present invention.

*Description of the FIG. 1 Precision Tuning System*

Referring to FIG. 1 of the drawings there is represented therein a block diagram of a preferred construction of a precision tuning system embodying the principles of the present invention. The precision tuning system, designated 10, includes means for providing a frequency stabilized signal. This means comprises a crystal controlled oscillator 15 connected in series with a plurality of frequency dividers. The crystal oscillator 15 may be constructed along conventional lines. The output signal from the crystal oscillator is preferably a sinusoidal signal whose frequency is stable over extended periods of operation. The oscillator 15 output signal is coupled from an output terminal 12 to an input terminal 13 of a frequency divider 14. The frequency divider, also of conventional construction, a regenerative divider for example, acts to divide the frequency of the crystal oscillator signal by a predetermined factor. For reasons that will become apparent hereafter, the frequency of the oscillator will be assumed to be five megacycles and the frequency divider 14 will be assumed to reduce the crystal oscillator frequency by a factor of 5. The output, one megacycle, signal from the frequency divider 14 is coupled from an output terminal 16 to an input terminal 17 of a second and similar frequency divider 18. The frequency of this signal is divided by a factor of 10 in the frequency divider 18 and the resultant 100 kilocycle signal is coupled through an output terminal 19 to an input terminal 21 of a third frequency divider 22. Here the signal undergoes a further reduction in frequency and is divided by a factor of 5 to generate a 20 kilocycle signal. The signals derived from the dividers are synchronized to the crystal oscillator 15 and are therefore, frequency stabilized. It is to be re-emphasized that the specified divisions have been assumed merely for purposes of illustration and may be changed to fit design considerations in other similar systems.

Referring to FIG. 1 it will be seen that the outputs of the respective frequency dividers 14, 18 ad 22 are also coupled to the fixed contacts of a switch, designated A. Switch A comprises one section of a ganged switch whose function and construction will be apparent hereinafter. The output terminal 16 from frequency divider 14 is connected to a pair of contacts *1a* and *3a* of a switch A while the output terminals 19 and 25 of frequency dividers 18 and 22 are coupled respectively to contacts *5a* and *7a*. A rotor 23 is provided on the switch for selecting one of the three available frequency stabilized signals for translation to other portions of the precision tuning system.

The precision tuning system 10 also includes means coupled to the frequency stabilized means for developing a pulse signal whose repetition rate is related to the stabilized frequency. The pulse generating means comprises a pulse shaper 24 having an input terminal 26 which is coupled to the rotor 23 of switch A for receiving the selected stabilized frequency signal. The pulse shaper 24 may take many forms that are well known in the art and, therefore, need not be described in detail. As is conventional, the pulse shaper 24 amplitude limits the incoming periodic frequency stabilized signal and converts the signal to a periodic pulse train whose repetition rate is equal to the frequency of the frequency stabilized signal and whose width is proportional thereto. The pulse train developed in pulse shaper 24 is coupled through an output terminal 27 to an input terminal 28 of an impulse generator 29.

It has been previously mentioned that this invention is primarily concerned with the problem of controlling the frequency of an oscillator by impulse means. It is well known in the art that impulse governing circuits operate most efficiently when the pulse width of the impulse is substantially equal to or less than half of the period of the highest frequency contemplated for the governed oscillator. In the present application oscillator frequencies in the order of 50 megacycles will be discussed and it is, therefore, essential that an extremely narrow pulse, or an impulse, be generated for governing the frequencies of the oscillator. A 10 millimicrosecond impulse has been found to give extremely satisfactory results at 50 megacycles. A pulse generator for developing this type of impulse signal may take the form of the relaxation oscillator described in the Beale et al. article found in the July 1957 issue of the Proceedings of Electrical Engineers (London) at page 394. Preferably however, because it has proven to be satisfactory, the impulse generator described in application Serial Number 745,877, entitled Pulse Generator, filed July 1, 1958, by the inventors of the present invention, should be used. The impulse generator 29 receives the pulse signal from pulse shaper 24 and is activated thereby.

The precision tuning system 10 also includes tunable means for providing a periodic signal, preferably a sinusoidal signal. The tunable means comprises a variable frequency oscillator 31 which may be constructed in any suitable manner. The variable frequency oscillator 31 includes two output terminals 32 and 33. One terminal 32 translates an oscillator output signal for utilization elsewhere. A portion of the output signal is also translated via an output terminal 33 to an amplifier 36 where it is amplified and translated to a following phase detector circuit 38.

Figure 4:
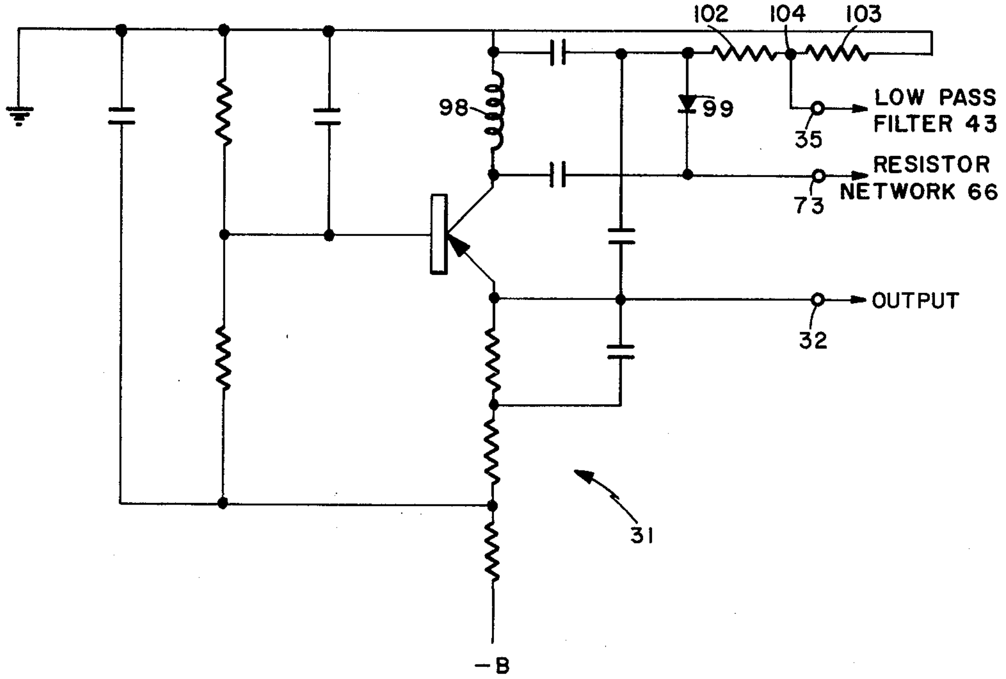
FIG. 4 is a schematic representation of a tunable or variable frequency oscillator.

To facilitate describing the operation of the precision tuning system 10, a preferred construction for the variable frequency oscillator 31 is shown in FIG. 4 and will be described hereinafter.

Phase detector 38 is responsive to the periodic sine signal derived from the variable frequency oscillator 31 and the impulse signal developed in the impulse generator 29 for developing trigger signals when the frequency of the periodic signal and the repetition rate of the pulse signals are integrally related and, therefore, in frequency coincidence.

It is recognized that normally a frequency coincidence occurs between a periodic signal and an impulse signal when a harmonic of the impulse repetition rate (frequency) is equal to the periodic signal frequency. However, for purposes of this invention these signals will be considered in frequency coincidence if there is a substantial equivalency between these frequencies. As will be seen the periodic signal frequency and the harmonic frequency may differ by several thousand cycles and still be considered in frequency coincidence. In other words, if the periodic signal frequency lies within a band of frequencies covering four thousand cycles either side of the harmonic frequency for example, a frequency coincidence will be assumed to exit. The above assumption is entirely reasonable because the periodic signal frequencies are in the order of several megacycles whereas the allowable difference is only several thousand cycles. These signals will also be considered in frequency coincidence although the frequency of one is varying with respect to the other, provided there is a substantial equivalency in their frequencies.

The phase detector 38 generates an audio signal when the frequency of the periodic signal approaches or departs from an integral relationship with the repetition rate of the impulse signal. Since the phase detector is sensitive to phase differences, the audio signal produced in the phase detector reflects the rate of change in the relative phases between these signals. As is well known frequency is a function of the rate of change in phase. In other words, an audio signal is developed in the phase detector 38 when these signals are in the region of frequency coincidence. Furthermore, it will be shown that during the course of the tuning operation the movement of the oscillator frequency will be terminated during a frequency coincidence. At this time, as explained above, there may exist a slight difference in the frequencies of the signals being coupled to the phase detector 38. As a result, an alternating signal, whose frequency is representative of the actual difference in the frequencies between the signals, is generated by the phase detector 38. When a true frequency coincidence is reached, a D.C. signal is developed in the phase detector 38. The D.C. signal reflects only the phase difference between the signals compared in the phase detector, since there is no longer any difference in their frequencies.

The signal developed in the phase detector 38 may be coupled by means of an output terminal 42 through a relay contact assembly K1—1 to either a low pass filter 43 or a band pass filter 44. The phase detector 38 is coupled to the latter through a contact "*a*" during the course of tuning the oscillator 31 and the signal derived therefrom, at this time, is an audio frequency signal.

The precision tuning system 10 is adapted to first tune the variable frequency oscillator 31 to a selected frequency and then maintain the variable frequency oscillator 31 at the selected frequency. When the variable frequency oscillator 31 is being maintained at the selected frequency, a D.C. signal is derived from the phase detector 38. This D.C. signal is translated through a contact "*b*" of the relay contact assembly K1—1 to the low pass filter 43. The low pass filter 43 is of conventional construction and acts to block the passage of spurious high frequency signals from being translated with the D.C. signal to the variable frequency oscillator 31. The manner in which the D.C. signal is used to control the frequency of the variable frequency oscillator 31 will be shown hereinafter.

When the variable frequency oscillator 31 is being tuned, the output of the phase detector is coupled through contact "*a*" of relay contact assembly K1–1 to an input terminal 46 of the band pass filter 44. The band pass filter 44 permits the frequency components of the audio signal which lie within a fixed band of frequencies, 2000–3500 c.p.s. for example, to be translated to an amplifier 49 where the signal, formed from the selected frequencies, is amplified and coupled to an input terminal 52 of a multivibrator 53. The amplifier 49 may be a form of the well known RC coupled amplifier since it is only called upon to amplify an audio signal. The multivibrator 53 is a monostable circuit and may take any of the forms that are familiar to persons skilled in the art. The amplified signal from amplifier 49 activates multivibrator 53 to develop a pulse trigger signal whose duration is determined by the circuit parameters of multivibrator 53. An output terminal 54 of multivibrator 53 is connected to an input terminal 55 of a preset counter and programmer 56.

A detailed description of the construction and operation of the programmer 56 will be presented in a separate section. The programmer 56 is connected through four output terminals 57 through 60 to contacts 1*b*, 3*b*, 5*b* and 7*b* of a switch B. A rotor 70 is connected to a terminal 61 for coupling switch B to a D.C. amplifier 62. The D.C. amplifier 62 is coupled to a relay coil K1 via a terminal 65. The relay coil K1 with the previously mentioned contact assembly K1–1 and a pair of contact assemblies K1–2 and K1–3 form a typical electromechanical ganged relay assembly.

The precision tuning system 10 also includes tuning means coupled between the tunable variable frequency oscillator 31 and the preset counter and programmer 56 for varying the frequency of the periodic signal through a band of frequencies which includes a selected frequency to which the oscillator 31 is to be tuned. The tuning means includes a pair of electric motors 63 and 64. The motors 63 and 64 are preferably D.C. permanent magnet motors whose direction of rotation may be changed by reversing the flow of current in the armature thereof. The tuning means also includes a resistor network 66 which comprises a parallel combination of a fixed resistor 67 and a pair of variable resistors 68 and 69 connected in series. The resistor network 66 is connected between a source of potential +B and ground. The variable resistors 68 and 69 include movable contacts 71 and 72 respectively. One end of resistor 68 is tied to movable contact 72. It will be obvious from FIG. 1 that the voltage at the movable contact 71 may be varied by moving either movable contact 71 and 72. Movable contact 72 is mechanically tied to motor 64 and constitutes a coarse tuning adjustment. Movable contact 71, on the other hand, is mechanically tied to motor 63 and is a fine frequency control. The variable resistors 68 and 69 are preferably of the type commercially known as "Helipots." Helipots are variable resistors whose value may be varied from a minimum to a maximum by rotating a shaft through several revolutions. Manifestly, the Helipots are ideally suited for motor driven operation.

The motors 63 and 64 are energized from a power supply 74 through a pair of switches E and F, a switch D, and relay contact assemblies K1–2 and K1–3. Switches E and F, and as will also be seen switches A through D, are two groups of switches that comprise several individual switches that are ganged to operate simultaneously. This may be done by mechanically tying the rotors of each group of switches together, or by constructing these switches in the form of multiple deck waver switches, which are widely used in the electronic art. In a wafer switch the rotors are mechanically connected to a central shaft which when rotated simultaneously rotates the attached rotors. Switches E and F and switches A through D are independently manually operated and constitute the primary control means for the precision tuning system 10. The contacts on these switches are numbered consecutively and carry a common lower case letter to identify the contact as being part of a particular switch, see FIG. 1. It will be further noted that the rotors in switches E and F are each constructed to make contact with two adjacent contacts. When these rotors are rotated counterclockwise, they pass to the next pair of contacts. In other words, when switches E and F are actuated, the rotors pass from contacts 1 and 2 to 3 and 4 or vice versa. The energizing path for motor 64, for example is as follows: current leaves a terminal 76 in power supply 74, passes through a movable contact 77 and a fixed contact 2*e*, and passes to a rotor 78 in switch D. From rotor 78 the current passes through contact 1*d* through relay contact assembly K1–3 to one side of the motor 64. The current leaving motor 64 is coupled to contact 1*f* on switch F and through a rotor 80 to a second terminal 79 on power supply 74. The energizing path for motor 63 may be similarly traced. The important distinction is that motor 64 is energized when rotor 78 is in contact with contacts 1*d* and 3*d* on switch D, while motor 63 is energized through contacts 5*d* and 7*d*.

As will be clear from FIG. 1 the current flowing in motors 63 and 64 may be reversed by rotating switches E and F clockwise so that their rotors are in contact with their respective contacts 3 and 4. When the switches E and F are rotated in this manner, the direction of rotation in the motors 63 and 64 is reversed. The movable contacts 71 and 72 are returned to the low resistance end of their travel when the motors are reversed. A pair of limit switches G and H are shown in the reversing energizing circuits of motors 63 and 64 and these act to deenergize the motors when the movable contacts 71 and 72 have reached the end of their reverse travel.

Finally the precision tuning system includes means for selectively providing a positive signal. The means comprises a resistor 86 coupled between a source of potential +B and contacts 2*c*, 4*c* and 6*c* of the switch C. The rotor 90 of switch C is connected to a reset terminal 91 of the preset counter and programmer 56.

*Description of the Preset Counter and Programmer 56*

Figure 2:
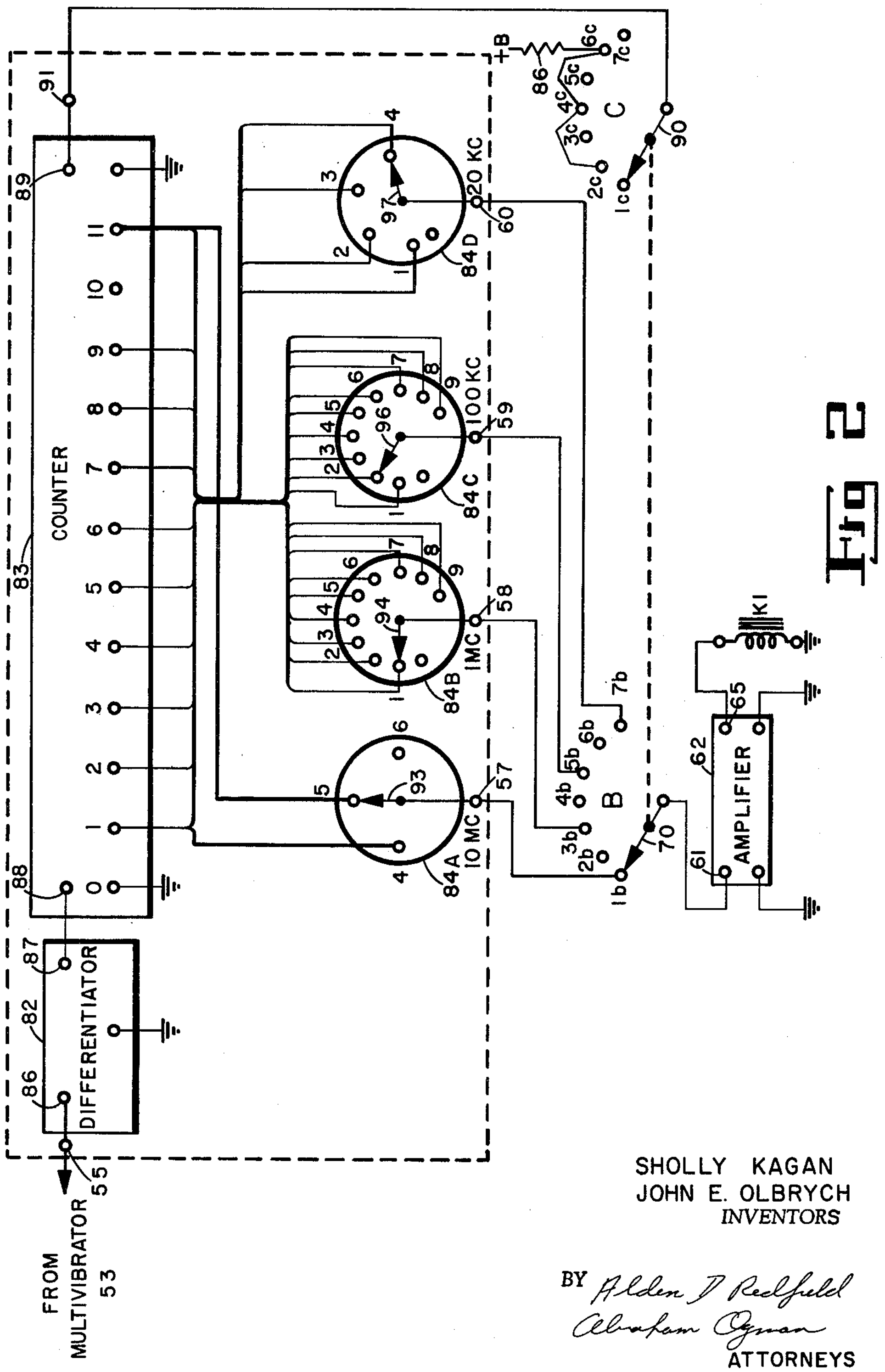
FIG. 2 is a partly schematic representation of a preset counter and programmer used in the FIG. 1 tuning system.

Referring to FIG. 2 of the drawings, there is shown a preferred embodiment of the preset counter and programmer 56, and portions of the FIG. 1 circuit which are useful in explaining its operation. It will be understood that the construction shown in merely for illustration and is not exhaustive of the means for duplicating the function of the FIG. 2 counter and programmer. The components of the counter and programmer 56 are shown within the dash outline and comprise a differentiator 82, a serial decimal counter 83 and switch means 84A through 84D. The pulse output from the multivibrator 53 is applied through terimnal 55 to the differentiator 82 where the signal is differentiated and coupled through terminals 87 and 88 to the counter 83. The counter 83 is open ended and may for example, take the form of a ring counter whose output to input feedback path has been removed. One such ring counter is described on page 161 of the August 1957 issue of the Periodical Electronic Industries and Tele-Tech, published by the Chilton Co. To convert the ring counter to an open ended counter, it is merely necessary to remove the capacitor coupling the last stage to the first stage. The counter 83 also includes a plurality of output terminals designated 1 through 11 and a reset terminal 89 connected to terminal 91.

Figure 3:
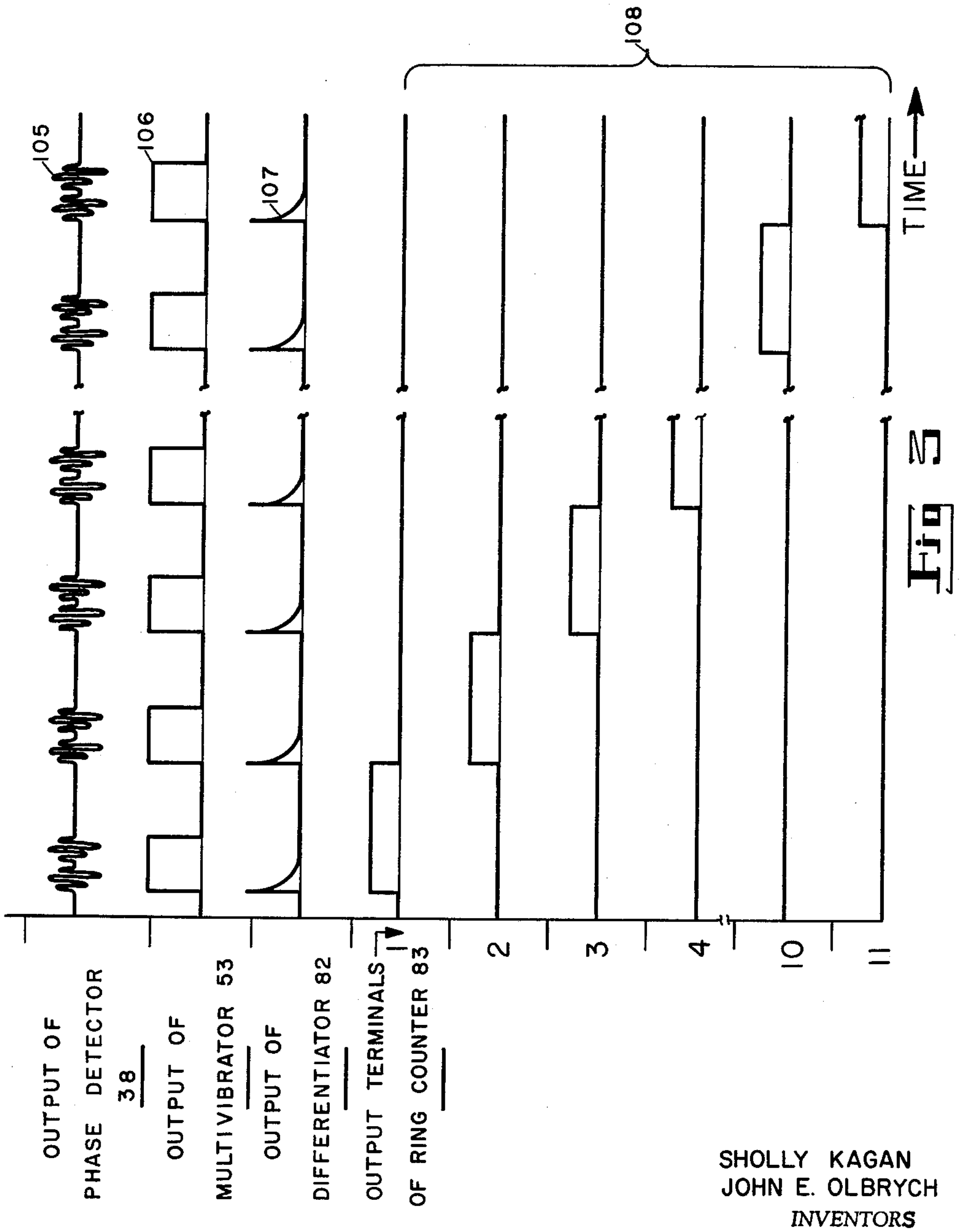
FIG. 3 shows curves useful in explaining the operation of the precision tuning system.

Reference will be made to FIG. 3 of the drawings during the ensuing discussion of the operation of the preset counter and programmer 56. Initially the potential at terminals 1 through 11 are all equal and assumed to be zero. See curve 108. The input signal comprises a series of pulse signals curve 106) derived from the multivibrator 53. These pulse signals are differentiated in the differentiator 82 and applied to the input terminal 88 of the counter 83. With the application of the first differentiated signal, the voltage at terminal 1 goes positive and remains positive until the second differentiated signal arrives. The second differentiated signal causes the voltage at terminal 1 to drop to zero and the voltage at terminal 2 to be increased to a positive value. It is clear from FIG. 3 that as subsequent differentiated signals are applied, the positive signal moves in succession from terminal 1 to terminal 11. After a signal is developed at termial 11, subsequent input pulses have no affect on the counter 83 since it is open ended at terminal 11. Thus terminal 11 remains positive until the counter is reset by an external overt act.

The counter 83 may be reset at any time by the application of a positive potential to the reset terminal 89. The positive potential is obtained by rotating switch C to an even numbered position *2c*, *4c*, or *6c*. When this occurs +B is coupled through resistor 86, switch C, and terminal 91 to reset terminal 89.

The switches 84A through 84D are used to program or select the frequency to which the oscillator 31 is to be tuned. Switches 84A through 84D each have a moving contact or rotor designated 93, 94, 96 and 97 respectively, and a plurality of fixed contacts. It will be shown later that the tuning operation consists of advancing oscillator 31 in incremental steps in a band of frequencies. Switches 84A through 84D select these frequency increments, in the relationship of 10 megacycles, 1 megacycle, 100 kilocycles, and 20 kilocycles. The numbers shown adjacent to the fixed contacts in the switches represent a multiplier for the increment of frequencies assigned to the particular switch. Like numbered fixed contacts on switches 84B, 84C and 84D are electrically connected together and to like numbered terminals on counter 83. To simplify FIG. 2, the majority of the electrical connections joining terminals 1–11 to the switches 84B through 84D are shown entering and leaving a cable (heavy lines). For switch 84A, terminals 1 and 11 of the counter 83 are coupled to fixed terminals 4 and 5 respectively, as shown. The manner in which these switches are used to determine the frequency to which the variable frequency oscillator 31 is to be tuned will be discussed in relation to the over-all operation of the precision tuning system 10.

*Description of the Variable Frequency Oscillator 31*

It will now be shown how the voltages derived from the resistor network 66 and from the low pass filter 43 are employed in the variable frequency oscillator 31 to tune it. Reference is made to FIG. 4 of the drawings where there is shown a schematic representation of one form of a variable frequency oscillator. Since we are interested in the tuning mechanism of the oscillator 31, this discussion will be limited to the means for tuning the resonant circuit of the oscillator 31. The resonant circuit comprises a coil 98 coupled in parallel with a variable capacitive element 99, the combination of which is in the collector circuit of a transistor. The capacitive element 99 is not a capacitor of the conventional form, but a semi-conductor element that functions like a capacitor whose capacity varies as a function of the voltage applied to it. This form of capacitive element is widely known as a Varicap. It will be noted that the Varicap 99 is isolated from the direct current path of the collector so that its effective capacitance is independent of the direct current in the transistor. One side of the Varicap 99 is coupled to two resistors 102 and 103 in series. The remote end of resistor 103 is coupled to ground. The opposite end of the Varicap 99 is coupled through terminal 73 to the movable contact 71 (FIG. 1) in the resistor network 66, and the potential across the Varicap 99 is primarily determined by the voltage appearing at the movable contact 71. The D.C. potential derived from the low pass filter 43 is coupled through a terminal 35 to a junction 104 between resistors 102 and 103. When a signal appears at the junction 104 it will also affect the voltage distribution across resistors 102 and 103 thus affecting the potential at the Varicap 99. It is recognized that other tuning methods may be used. One such method is to mechanically tie a variable capacitor to the motors. The circuit described was found to be more reliable.

*Operation of the FIG. 1 Precision Tuning System*

Before describing, in detail, the operation of the FIG. 1 precision tuning system the theory of operation will be generally discussed. An important objective of the invention is to provide a precision tuning system which is capable of tuning a variable frequency oscillator to a selected one of a multitude of frequencies within a frequency band without ambiguity and with precision. In the precision tuning system 10 there are two sources of substantially periodic signals. One source comprises a crystal oscillator 15 and associated frequency divider circuits. As explained heretofore the divider circuits are used to develop impulse signals whose repetition rate, or frequency, is related to the frequency of the crystal oscillator 15. The stability of these repetition rates are of the same order of magnitude as that of the crystal oscillator 15.

The second signal source is a variable frequency oscillator 31 that is tunable over a frequency band. A feature of this invention is that the tuning mechanism need not be precise nor capable of being precisely calibrated. There are merely two restrictions on the tuning mechanism for the variable frequency oscillator. The first restriction is that the oscillator frequency is initially returned to some frequency below the aforementioned frequency band. Secondly, the oscillator is tuned in one direction only, namely towards higher frequencies. Both of these restrictions do not add materially to the complexity of the equipment or its cost.

To tune the oscillator 31 to a specified frequency in accordance with this invention, the oscillator is advanced in frequency in discrete predetermined increments. At the conclusion of the final increment of frequency, the oscillator is tuned to the desired specified frequency.

Briefly, the tuning procedure is as follows. At the start of the operation the oscillator 31 is tuned to a frequency below the band of frequencies in which it is to operate. At the start of the first phase of the tuning operation, the tuning mechanism is activated and the oscillator starts to increase in frequency towards the lowest frequency in the specified band. A portion of its output voltage is applied as one input to a phase detector 38 where it is instantaneously compared with a frequency stabilized impulse signal which represents the second input to the phase detector. It is well known that a true frequency coincidence between these signals occurs when the oscillator signal is an integral multiple of a harmonic of the impulse repetition rate, repetition frequency. It is also well known that as the input signals approach and leave a true frequency coincidence there is produced at the output of the phase detector an audio signal. These audio signals are modified to form trigger signals which are counted in a preset counter and programmer circuit. When the number of trigger signals produced equals a predetermined number as determined by the preset counter and programmer 56, a control output signal is generated from the preset counter and programmer 56, which activates a circuit which in turn terminates the first tuning phase of the variable frequency oscillator. When the predetermined count is reached and the oscillator tuning terminated, the output of the phase detector 38 is connected to the variable frequency oscillator 31 through the low pass filter 43 and subsequently synchronizes the oscillator 31 to the frequency stabilized source, in this case a harmonic of the impulse repetition rate.

The precision tuning system is adjusted so that the first frequency coincidence occurs at the lowest frequency in the specified band of frequencies. This first coincidence, therefore, establishes a reference point from which increments of frequency may be added to obtain a specific desired frequency. It will be noted that until the first coincidence occurs there is no reference frequency which may be referred to for performing the oscillator tuning. This makes it possible to dispense with establishing an accurate initial oscillator frequency as by precise calibration.

In the next phase of the tuning operation, another frequency stabilized impulse signal is coupled to the phase detector and the tuning mechanism for the variable frequency oscillator is again activated. As the oscillator frequency is increased there occur additional frequency coincidences in the phase detector which result in the generation of additional audio signals. In this second phase, the frequency stabilized signal may be equal or of a lesser frequency than the frequency stabilized signal used in the first tuning phase, depending on the increment of frequency to be added to that obtained in the first tuning phase. These audio signals are again counted in the preset counter and programmer and at a predetermined count, an output control signal is generated which again terminates the tuning phase. It is clear that in this second phase, the oscillator has been advanced a specific increment of frequency which is an integral multiple of the repetition rate of the frequency stabilized signal.

The number of tuning phases will depend largely on the accuracy to which it is desired to tune the oscillator. This will be apparent from the typical tuning operation to be described hereinafter.

Another feature of this invention is to activate an automatic frequency control circuit simultaneously with the termination of each tuning phase. This is done by switching the output from the phase detector through a low pass filter 43 to the variable frequency oscillator. It will be remembered that the oscillator 31 is brought to rest at some frequency within the assumed region of frequency coincidence, or at a frequency which may be at or substantially close to a true frequency coincidence. Accordingly, the automatic frequency control circuit is employed to bring the variable frequency oscillator into true frequency coincidence with the harmonic of impulse signal repetition rate, and to maintain the oscillator 31 at this frequency.

To illustrate and explain the aforementioned operation in detail, a typical tuning operation will be described. The frequencies and other parameters described in the illustrative problem represent one set of judiciously selected parameters. These may be changed to suit a specific requirement without alternating or departing from the spirit of this invention.

Reference will be made to the figures during the course of this description. It is proposed to tune the variable frequency oscillator 31 to a frequency of 51.280 megacycles in this illustrative problem. In this connection, switches 84A through 84D are adjusted to this frequency in the manner indicated in FIG. 2. Adjacent frequency channels will assume to be separated by 20 kilocycles, and if it is desired to tune in a 40 to 60 megacycle band, it is possible to obtain 1000 frequency channels from a single crystal controlled source.

The variable frequency oscillator 31 is initially assumed to be generating at the lowest frequency which it is adjusted to operate. For reasons to be apparent hereafter, this frequency is larger than 39 megacycles but smaller than 40 megacycles. It is immaterial at what frequency the oscillator happens to be tuned providing it lies within the limits just specified. Switches A through D are adjusted so that the rotors are in contact with the first fixed contact in the respective switches. Under these conditions a one megacycle signal is being coupled through a switch A to the pulse shaper 24. The one megacycle frequency stabilized signal is modified in the pulse shaper 24 into a one megacycle pulse train which is coupled to the impulse generator 29 where it acts as a trigger signal for generating an impulse train whose repetition rate (frequency) is one megacycle.

It is further assumed that motors 63 and 64 have been reversed and that the movable contacts 71 and 72 on the variable resistors 68 and 69 have been returned to their low resistance positions. Additionally, switches G and H, which lie only in the energizing circuit for reversing the motors 63 and 64 are open, indicating that the motors 63 and 64 have reached the limit of their reverse travel. Finally, the rotors 77 and 80 of switches E and F are in contact with their respective contacts 3 and 4. To start the tuning operation the rotors 77 and 80 are rotated counterclockwise into contact with their respective contacts 1 and 2. The previously described energizing circuit for motor 64 is thereby completed and the motor 64 starts to move the movable contact 72 upward along the variable resistor 69. Motor 63 is not energized at this time because, as seen in FIG. 1, its energizing circuit is interrupted at switch D where the rotor 78 is in contact with the fixed contact 1*d* and, therefore, not in the energizing circuit of motor 63. The aforementioned movement of variable contact 72 raises the voltage appearing at movable contact 71 and consequently raises the voltage being applied to terminal 73 of the variable frequency oscillator 31. As previously discussed the rising voltage at terminal 73 increases the voltage across the Varicap 99. Varicap 99 adjusts its capacity in accordance with the increasing voltage. Since this capacity is part of the resonant circuit of the variable frequency oscillator 31, the frequency of the oscillator 31 will vary with the voltage at terminal 73. For purposes of this invention it will be assumed that the capacity of the Varicap 99 is inversely proportional to the voltage applied thereto and, therefore, as the voltage at terminal 73 is increased by the upward movement of the movable contact 72, the oscillator frequency will increase. A portion of the oscillator signal is coupled from terminal 33 through the amplifier 36 to an input terminal 39 of the phase detector 38 where it is mixed with and compared with the one megacycle impulse signal originating from the impulse generator 29. The first frequency coincidence will occur between the oscillator signal and the fortieth harmonic of one megacycle impulse train when the oscillator frequency is adjusted to 40 megacycles. Frequency coincidences will also occur at each megacycle thereafter. As the oscillator approaches and leaves 40 megacycles there is generated at the output of the phase detector 38 an audio signal, the nature of which is shown in curve 105 in FIG. 3. The audio signal is made up of many individual audio signals. The frequencies of which vary from D.C. to about 4000 cycles per second. The audio signal is translated through the normally closed contact "*a*" of relay contact assembly K1–1 and is applied to the band pass filter 44 where the frequencies less than 2000 cycles and exceeding 3000 cycles are rejected. A band pass filter was chosen because of its simplicity as compared to a low pass filter designed to reject all frequencies above 3500 cycles. The band pass filter 44 is preferably a simple tuned circuit. The output signal from the band pass filter 44 is amplified in the amplifier 49 and applied to the input terminal 52 of the multivibrator 53. This amplified signal triggers the multivibrator 53 and there is developed therein a pulse trigger signal (curve 106) whose duration is slightly longer than the time required for generating the audio signals. This time relationship is shown in curves 105 and 106 of FIG. 3. It was found that by making the multivibrator pulse equal to or slightly longer than the time required to generate the audio signals, the possibility of developing a second pulse at the trailing edge of the audio signal developed when the oscillator tunes passed a phase coincidence was obviated. The multivibrator 53 is provided merely to improve the reliability of the system and is not necessary for its operation. The audio signal may be applied directly to a preset counter and programmer 56.

The multivibrator output signal is coupled through an input terminal 55 in the preset counter and programmer 56, (see FIG. 2). After entering the preset counter and programmer 56, it is translated through the differentiator 82 where it is differentiated and clipped to provide signal, as is shown in curve 107 in FIG. 3. The differentiating signal is applied to the counter 83 activating it. In this instance the differentiated signals appearing at the counter 83 represent one megacycle increments. With the application of each successive differentiated signal there appears in succession and in sequence a signal at the output terminals 1 through 11 of the counter 83, as shown in curves 108, in FIG. 3.

Although the output signals appear at each of the terminals 1 through 11, only the signals appearing at the 1 and 11 terminals are applied at switch 84A. An output signal is developed at the 1 terminal in counter 83 at the first frequency coincidence at 40 megacycles. This signal appears at the 4 terminal in switch 84A. However, it is not translated further because the rotor 93 is in contact with the contact 5 on swich 84A. I is also seen that the signals translated through the first contacts on switches 84B, 84C and 84D are prevented, in this instance, from being translated to the amplifier 62 by switch B. The rotor 70 is in contact only with terminal 1*b* therein, and thus switch B will translate only signals originating from switch 84A. Consequently, the signal in this first tuning phase which is applied to the amplifier 62 is derived from terminal 11 in counter 83 following 11 frequency coincidence which occurs at 50 megacycles. This signal passes through contact 5, or the 50 megacycle contact, and rotor 93 on switch 84A, and is conducted through terminal 1*b* and rotor 70 on switch B to the input terminal 61 of the amplifier 62. The output signal from the counter 83 is a D.C. signal which is amplified in the amplifier 62 to a magnitude sufficient to energize the relay coil K1. The relay contact assemblies K1–1 through K1–3 associated therewith, are thus moved from the normally closed position shown in FIG. 1 to an open position. Since relay contact assembly K1–3 is in the energizing circuit of motor 64 the motor is de-energized when the relay coil K1 is energized. This brings the first tuning phase to an end.

When the relay coil K1 is energized, the relay contact assembly K1–1 moves from contact "*a*" to "*b*" and connects the low pass filter 43 to the output of the phase detector 38. This movement of the relay contact assembly K1–1 closes the automatic frequency control loop and there is applied to terminal 35 of the variable frequency oscillator 31 a direct frequency control voltage. Since the tuning operation is terminated substantially instantaneously with the generation of the 11th frequency coincidence, the variable frequency oscillator is tuned to a frequency sufficiently close to 50 megacycles to enable the D.C. signal at terminal 35 to lock the oscillator 31 in at exactly 50 megacycles. Referring once again to FIG. 4 of the drawings it is seen that the signal at terminal 35 is coupled to the junction 104 between resistors 102 and 103 in the direct current path of the Varicap 99. This signal alters the division of voltage between the resistors 102 and 103 sufficiently and in the correct direction for locking the oscillator at exactly 50 megacycles.

The second tunng phase, that of tuning the oscillator to 51 megacycles, or adding a one megacycle increment, is initiated by rotating the switches A through D to position 3. In passing from contact 1*c* to contact 3*c*, rotor 90 of switch C makes contact with the second contact 2*c*. During the time that rotor 90 is in contact with 2*c*, a positive signal is coupled from +B, through resistor 85 (FIG. 2) to the reset terminal 86 on the counter 83. The positive signal resets the counter to its initial operating state where the potential at terminals 1 through 11 on counter 83 are zero. At terminal 3*a* switch A picks up, once again, the one megacycle frequency stabilized signal which, in a manner previously described, eventually generates an impulse train whose repetition frequency is one megacycle. Since the repetition rate of the impulse train has not been changed the phase coincidences between the oscillator signal and the impulse train, which occur in phase detector 38, again occur at one megacycle intervals.

As a result of resetting the counter 83, the D.C. signal developed at its terminal 11 during the first tuning phase, is removed, thus de-energizing relay coil K1. The relay contact assembly K1–1 is returned to its normally closed position "*a*" and the audio signals developed in the phase detector 38 are again routed to the preset counter and programmer 56. The relay contact assembly K1–3 is also returned to its normally closed position "*e*," thereby reactivating the motor 64, causing it to start the oscillator tuning toward a higher frequency once again.

The first frequency coincidence occurs at 51 megacycles and there is developed at terminal 1 in counter 83, a positive signal. This signal is carried through contact 1 on switch 84B and through terminal 58, to contact 3*b*. The signal then passes from contact 3*b* through rotor 70 to the amplifier 62 and finally to relay coil K1 energizing it. In the manner described heretofore, the relay contact assemblies K1–1 through K1–3 move to their normally open positions and the second tuning phase is terminated as motor 64 is again de-energized.

The third phase of the tuning operation consists of advancing the variable frequency oscillatr 31 from 51 megacycles to 51.2 megacycles. To start the third phase the switches A through D are rotated past their respective contacts 4 to contacts 5. In passing contact 4*c*, the switch C translates a positive signal through terminal 89 to counter 83, resetting it. Relay K1 is de-energized and power is applied to motor 63, reactivating the tuning operation. Motor 63 is energized in this instance because the rotor 78 of switch D is in contact with contact 5*d* thereby connecting the power supply 74 to motor 63. With motor 63 energized the movable contact 71 of the variable resistor 68 is moved to increase the voltage applied to the variable frequency oscillator 31. Accordingly, the oscillator frequency starts to increase again. The combination of motor 63 and variable resistor 68 are provided to decrease the rate of change in voltage to oscillator 31 to reduce the rate of change, of the oscillator frequency. In this way the time between frequency coincidences, where these coincidences occur at less than one megacycle increments, can be controlled to some degree. The tuning procedure of this phase three is substantially identical to the first two with the following exception. With rotor 23 of switch A connected to contact 5*a* there is generated in the impulse generator 29, impulse signals whose repetition rate is 100 kilocycles. In the manner heretofore described frequency coincidences now occur in the phase detector 38 at 100 kilocycle intervals. In this instance, also, the rotor 96 of switch 84C in the preset counter and programmer 56 is connected to its terminal 2. Consequently, the second frequency coincidence signal, constituting a control signal, is translated from the counter 83 through the switch 84C to switch D, and finally to the D.C. amplifier 62. In amplifier 62 the control signal is amplified and energizes relay coil K1 terminating the third tuning phase.

The final tuning phase, that of advancing the oscillator 80 kilocycles is accomplished in a similar manner. The switches A through D are rotated to position 7 thereby coupling a 20 kilocycle frequency stabilized signal to the impulse generator 28. As a result frequency coincidences occur every 20 kilocycles and when four of these coincidences are counted by the counter 83 the fourth tuning phase is terminated.

After the fourth and final tuning phase the relay coil K1 is maintained in an energized condition until it is desired to retune the oscillator. To retune the oscillator, switches E and F are rotated clockwise to complete the reversing circuit for motors 63 and 64. These motors are activated and return the movable contacts 71 and 72 to their initial lowermost positions. The oscillator is thereby tuned to a frequency below the aforementioned 40–60 megacycle band. Switches A through D are returned to their respective first contacts and in the process switch C resets counter 83. The precision tuning system is now adjusted to the initial conditions specified at the start of this discussion on its operation. To obtain a new frequency it is merely necessary to adjust switches 84A through 84D to the new setting and proceed as before.

The precision tuning system 10, as described is capable of reliably selecting without ambiguity 1 of 1000 different channels in the frequency band by the 40 megacycles and 60 megacycles. These bands are separated by 20 kilocycles. It is entirely feasible to narrow the separation between bands by providing a frequency stabilized signal whose frequency is less than 20 kilocycles. It will also be noted that the circuits and components used in the precision tuning system 10 are not complex nor are they numerous. As a result it has been found that with the use of transistors and other space saving components the precision tuning system 10 could be packaged in less than ¼ of a cubic foot. Known tuning systems having the reliability, the precision, and the stability of the precision tuning system 10 are exceedingly complex. The smallest of these systems are housed in a package which is several orders of magnitude larger than the ¼ cubic foot specified herein.

The various features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims.

We claim:

1. A precision tuning system comprising: means for providing a frequency stabilized signal; tunable means for providing a periodic signal whose frequency may be varied; circuit means responsive to the phase difference between the frequency stabilized signal and the periodic signal for generating an audio-frequency signal which is converted into a single trigger signal when the aforementioned signals are in frequency coincidence; control means coupled to said circuit means and said tunable means, said control means being adapted to tune said tunable means through one and more frequency coincidences and for counting the trigger signals, said control means being further adapted to terminate said tuning operation when a predetermined number of trigger signals are received, thereby adjusting said tunable means to a desired frequency within the aforementioned band of frequencies.

2. A precision tuning system as described in claim 1 which in addition includes circuit means for maintaining said tunable means tuned to the desired frequency.

3. A precision tuning system as described in claim 1 in which said control means comprise a preset counter and programmer and tuning means, said preset counter and programmer being coupled to said circuit means for counting the trigger signals and developing a control signal, and said tuning means being coupled to said tunable means and being responsive to said control signal for terminating the tuning operation.

4. A precision tuning system as described in claim 3 in which said preset counter and programmer includes a serial decimal counter for counting said trigger pulses and switch means for selecting the number of trigger pulses to be counted.

5. A precision tuning system comprising: means for providing a frequency stabilized periodic signal; tunable means for providing a periodic signal whose frequency may be varied; means coupled to said frequency stabilized means for developing a pulse signal whose repetition rate is related to the stabilized periodic signal; means responsive to the periodic signal and the pulse signal for developing an audio-frequency signal which is converted into a single trigger signal when the frequency of the periodic signal and repetition rate of the pulse signal are in frequency coincidence; means responsive to the trigger signals for determining when a predetermined number of trigger signals have been developed, at which time a control signal is developed therein; and tuning means coupled between said tunable means and said last mentioned means for varying the frequency of the periodic signal through one and more frequency coincidences, said tuning means being responsive to the control signal for terminating the tuning function of said tuning means for adjusting the frequency of tunable means to a desired frequency in the aforementioned band.

6. A precision tuning system as described in claim 5 in which said tuning means comprises; a normally energized electric motor coupled to said tunable means, and a relay in the energizing circuit thereof, said relay being responsive to the control signal for interrupting the motor energizing circuit for terminating the tuning operation.

7. A precision tuning system comprising: a crystal controlled frequency stabilized oscillator for generating a frequency stabilized periodic signal; frequency dividing means for dividing the frequency stabilized periodic signals for generating a plurality of discrete lower frequency signals; switch means coupled to said frequency dividing means for selecting one of the discrete frequency signals; impulse generating means coupled to said frequency dividing means through said switch means for generating periodic impulse signals whose repetition rate is equal to the frequency of the selected discrete frequency signal; a tunable oscillator for providing a periodic signal whose frequency may be varied; means for tuning the tunable means through a predetermined frequency band; a phase detector responsive to the periodic signal and the impulse signals for generating a trigger signal each time frequency of the periodic signal is an integral multiple of the repetition rate of the impulse signals; means coupled to said phase detector for counting the number of trigger signals and for developing a control signal when a predetermined count has been reached; frequency control means for maintaining the periodic signal at a selected frequency; and means responsive to the control signal for terminating the action of the tuning means and for coupling said phase detector to said frequency control means.

8. A precision tuning system as described in claim 7 in which said counting means comprises a serial decimal counter coupled to a frequency selecting means, said counter being adapted to count the trigger signals and said frequency selecting means providing for selecting a count representing a selected frequency.

9. A precision tuning system comprising: a crystal controlled frequency stabilized oscillator for generating a frequency stabilized signal; frequency dividing means for dividing the frequency stabilized signals for generating a plurality of discrete lower frequency signals; switch means coupled to said frequency dividing means for selecting one of the discrete frequency signals; impulse generating means coupled to said frequency dividing means through said switch means for generating periodic impulse signals whose repetition rate is equal to the frequency of the selected discrete frequency signal; a tunable oscillator for providing a periodic signal whose frequency may be varied; means for tuning the tunable means through a predetermined frequency band; a phase detector responsive to the periodic signal and the impulse signals for generating an audio signal when the frequency of the periodic signal is an integral multiple of the repetition rate of the impulse signals; means for converting the audio signal into a pulse trigger signal; means coupled to said converter means for counting the number of trigger signals and for developing a control signal when a predetermined count has been reached; frequency control means for maintaining the periodic signal at a selected frequency; and means responsive to the control signal for terminating the action of the tuning means and for coupling said phase detector to said frequency control means.

10. A precision tuning system for tuning an oscillator to a selected frequency by varying the oscillator frequency in incremental steps comprising: oscillator tuning means adapted to vary the frequency of the signal derived from the oscillator; means for providing a plurality of periodic frequency stabilized signal; comparison means responsive to the phase difference between a frequency stabilized signal and the oscillator signal for providing a trigger signal when the oscillator sweeps through a frequency that is a multiple of the repetition frequency of the frequency stabilized signal; circuit means for counting the trigger signals until a predetermined number are developed, at which time the oscillator tuning is terminated; and means for selecting and coupling another frequency stabilized signal to said comparison means for reactivating said tuning means to tune said oscillator through another increment of frequency, said oscillator coming to rest at the selected frequency after the last selection is made.

11. A precision tuning system for tuning an oscillator to a selected frequency by varying the oscillator frequency in incremental steps comprising: oscillator tuning means adapted to initially adjust the frequency of the oscillator signal below a predetermined frequency and to tune the oscillator through a band of frequencies; means for providing a plurality of frequency stabilized signal; comparison means responsive to the phase difference between the oscillator signal and a frequency stabilized signal for producing a trigger signal when the oscillator sweeps past a frequency that is a multiple of the repetition frequency of the frequency stabilized signal, the first trigger signal being developed at the predetermined frequency; circuit means for counting the trigger signals until a predetermined number are developed, at which time frequency of the oscillator signal is equal to an integral multiple of the repetition frequency of the frequency stabilized signal; means for selecting and coupling another frequency stabilized signal to said comparison means and for reactivating said tuning means to tune said oscillator through another increment of frequency, and the successive increments of frequency being added to the predetermined frequency, said oscillator coming to rest at the selected frequency after the last selection is made.

References Cited in the file of this patent

UNITED STATES PATENTS

| | | |
|---|---|---|
| 2,523,106 | Fairbairn et al. | Sept. 19, 1950 |
| 2,574,482 | Hugenholtz | Nov. 13, 1951 |
| 2,706,251 | Russell et al. | Apr. 12, 1955 |
| 2,794,920 | Salmet | June 4, 1957 |
| 2,827,567 | White | Mar. 18, 1958 |
| 2,856,529 | Mielke | Oct. 14, 1958 |

OTHER REFERENCES

"An Analysis of Pulse-Synchronized Oscillators," by Salmet, in Proc. of the IRE, November 1956, pages 1582–1594.

Article by Hugenholtz in Communication News, vol. XI, No. 1, May 1950, pages 13–21.

Article by Hugenholtz et al., in Communication News, vol. IX, No. 1, September 1947, pages 21–32.

Article by Hugenholtz in Philips Technical Review, vol. 14, No. 5, November 1952, pages 130–140.